(12) United States Patent
Ooka

(10) Patent No.: US 8,441,088 B2
(45) Date of Patent: May 14, 2013

(54) MANUFACTURING METHOD OF SOLID-STATE IMAGING DEVICE AND SOLID-STATE IMAGING DEVICE

(75) Inventor: Yutaka Ooka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/328,459

(22) Filed: Dec. 16, 2011

(65) Prior Publication Data

US 2012/0168889 A1 Jul. 5, 2012

(30) Foreign Application Priority Data

Jan. 5, 2011 (JP) .................................. 2011-000805

(51) Int. Cl.
*H01L 31/0232* (2006.01)
(52) U.S. Cl.
USPC .............. 257/432; 257/E31.127; 257/E31.11; 438/65; 438/66; 438/67; 438/68; 438/69
(58) Field of Classification Search .................. 257/432, 257/E31.127, E31.11; 438/65–69
See application file for complete search history.

(56) References Cited

U.S. PATENT DOCUMENTS

| 5,734,190 A * | 3/1998 | Hawkins et al. ............... 257/432 |
| 7,670,758 B2 * | 3/2010 | Wang et al. ..................... 430/321 |
| 7,879,630 B2 * | 2/2011 | Kaise et al. ...................... 438/29 |
| 8,017,923 B2 * | 9/2011 | Inoue et al. ............... 250/504 R |
| 8,027,087 B2 * | 9/2011 | Perkins et al. ........... 359/485.05 |
| 2004/0008416 A1 * | 1/2004 | Okuno ........................... 359/566 |
| 2005/0111072 A1 * | 5/2005 | Miyagaki et al. ............. 359/279 |
| 2008/0049191 A1 * | 2/2008 | Endo ................................. 353/22 |
| 2009/0135355 A1 * | 5/2009 | Kumai ........................... 349/114 |
| 2009/0316381 A1 * | 12/2009 | Kurt ............................. 362/19 |
| 2010/0282945 A1 * | 11/2010 | Yokogawa ................. 250/208.1 |
| 2011/0032376 A1 * | 2/2011 | Takizawa ................... 348/222.1 |
| 2012/0061553 A1 * | 3/2012 | Yokogawa ................. 250/208.1 |
| 2012/0105745 A1 * | 5/2012 | Kumai ............................... 349/5 |

FOREIGN PATENT DOCUMENTS

JP 2008-216956 A 9/2008

* cited by examiner

*Primary Examiner* — Kyoung Lee
*Assistant Examiner* — Ankush Singal
(74) *Attorney, Agent, or Firm* — Rader, Fishman & Grauer PLLC

(57) ABSTRACT

A manufacturing method of a solid-state imaging device includes: preparing a photoelectric conversion device; forming an insulating layer on a surface of the photoelectric conversion device; forming a wire-grid polarizer on a support base; bonding a forming surface of the wire-grid polarizer on the support base to the insulating layer on the surface of the photoelectric conversion device and removing the support base from the wire-grid polarizer.

8 Claims, 13 Drawing Sheets

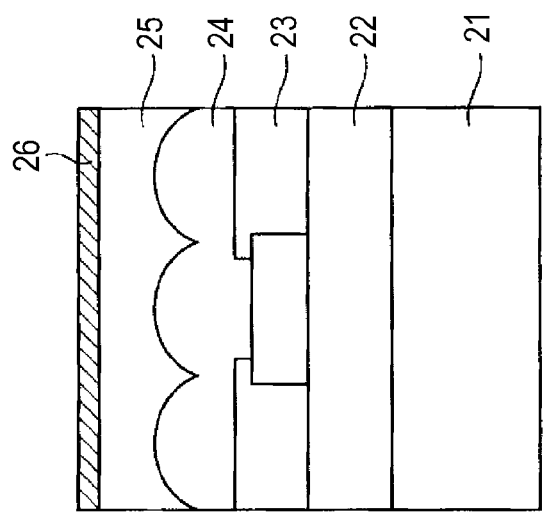
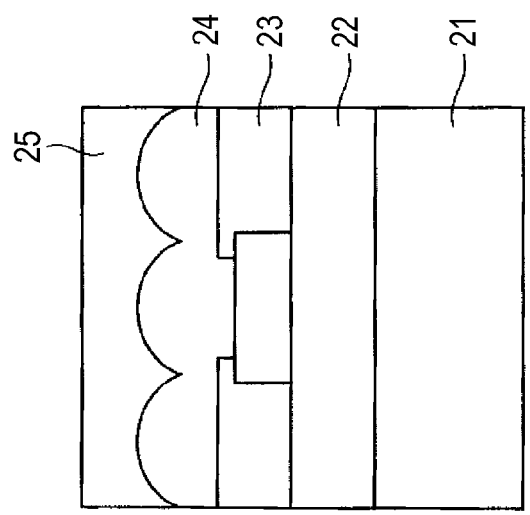
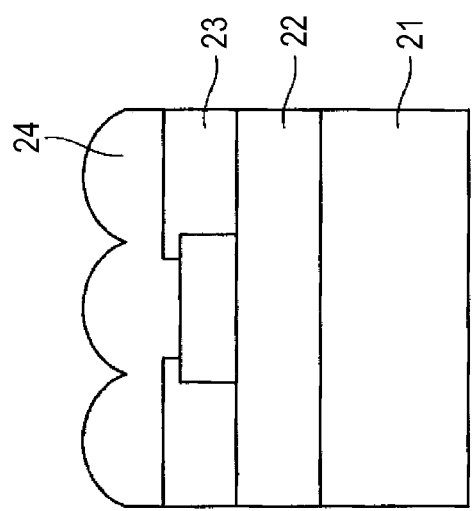

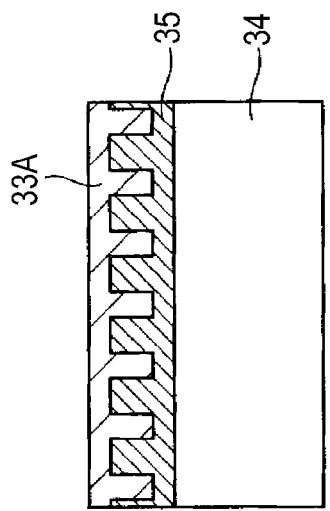
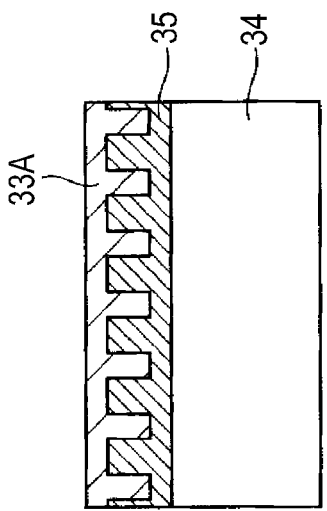
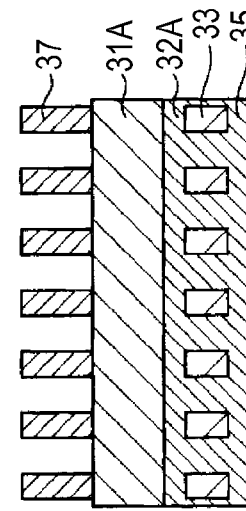
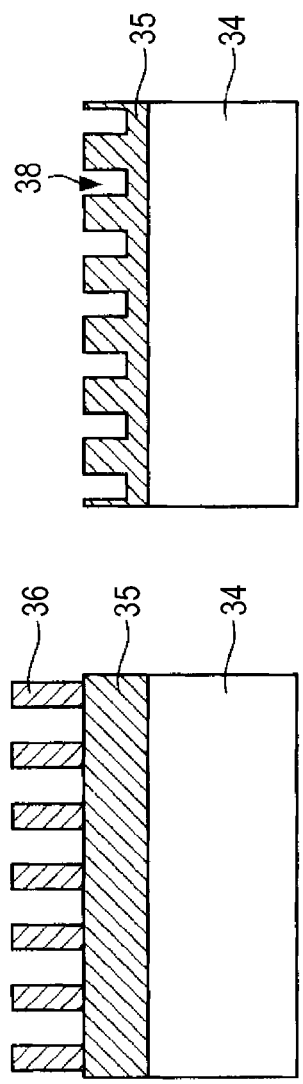
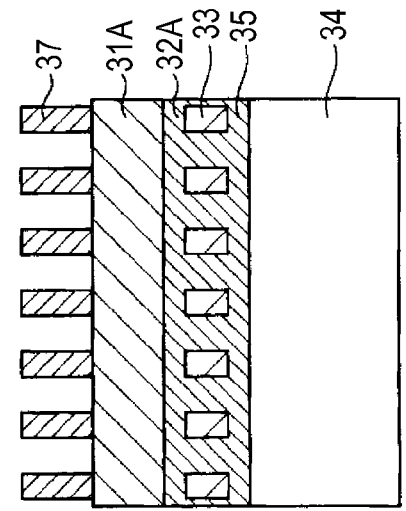
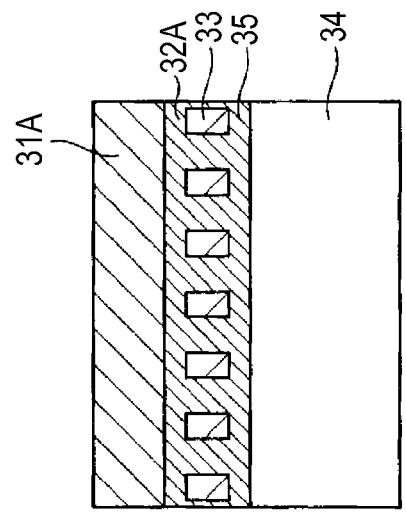
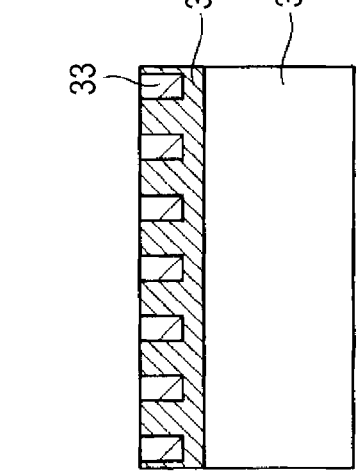

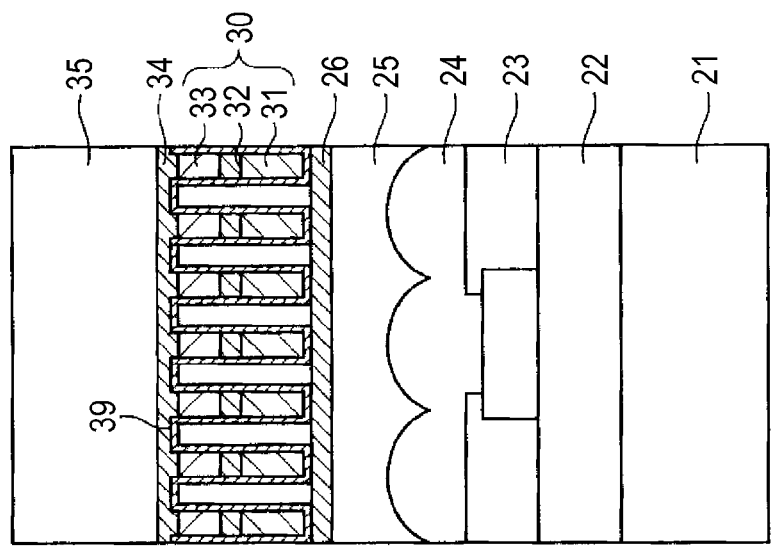
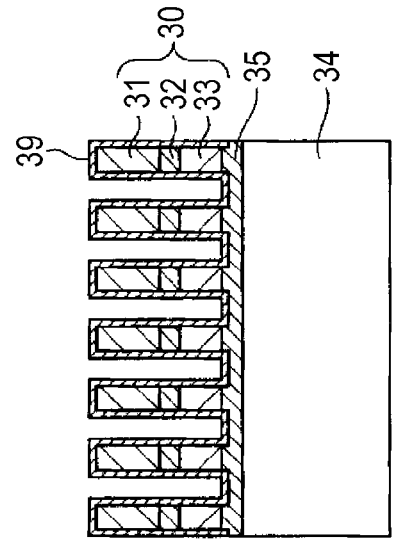
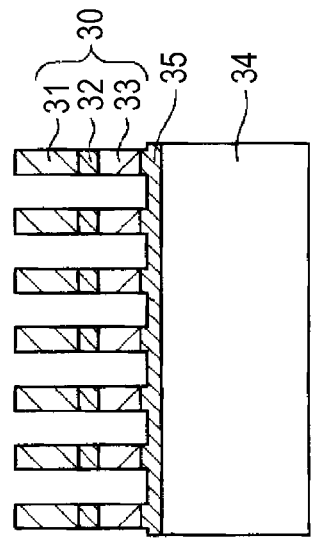

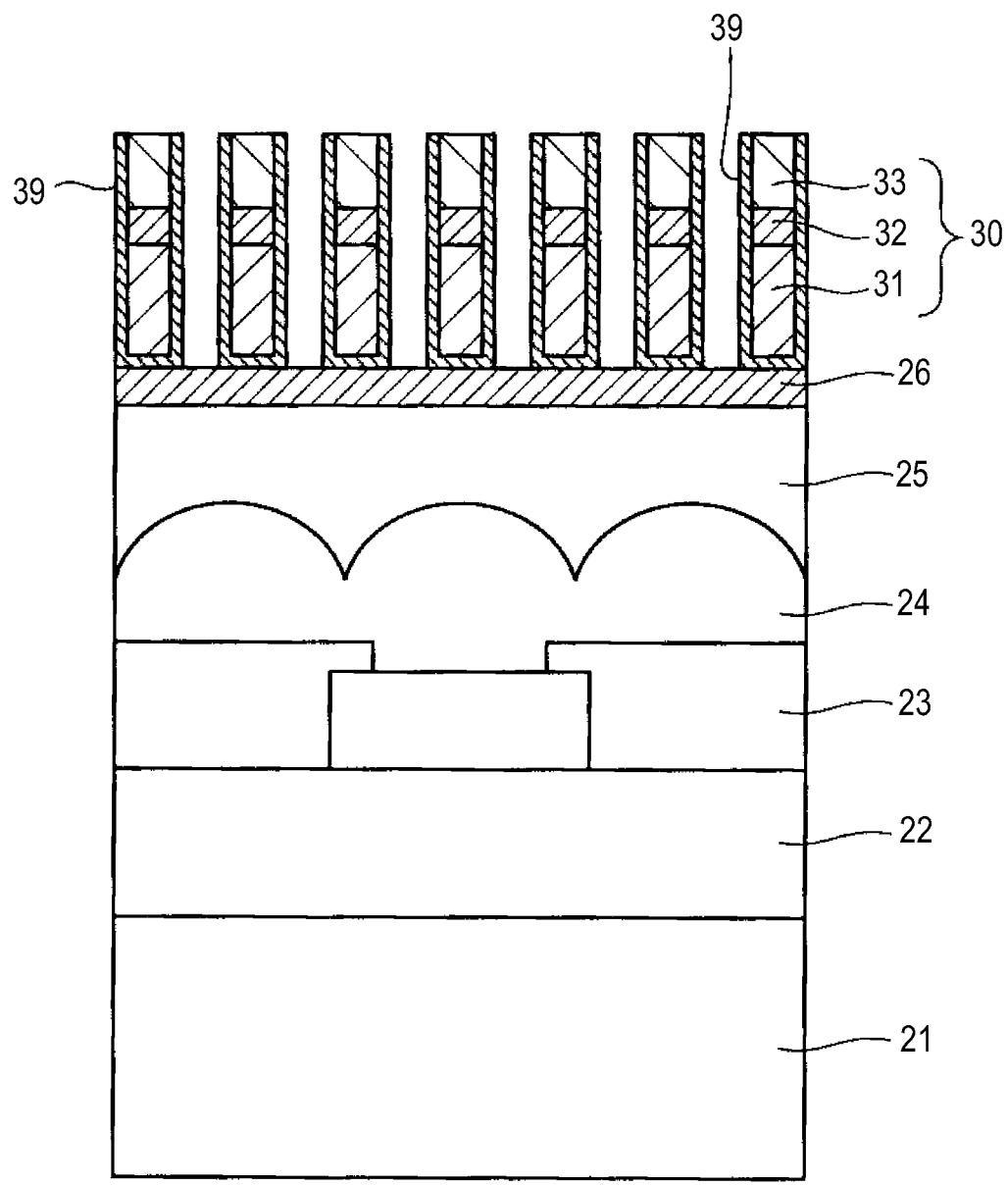

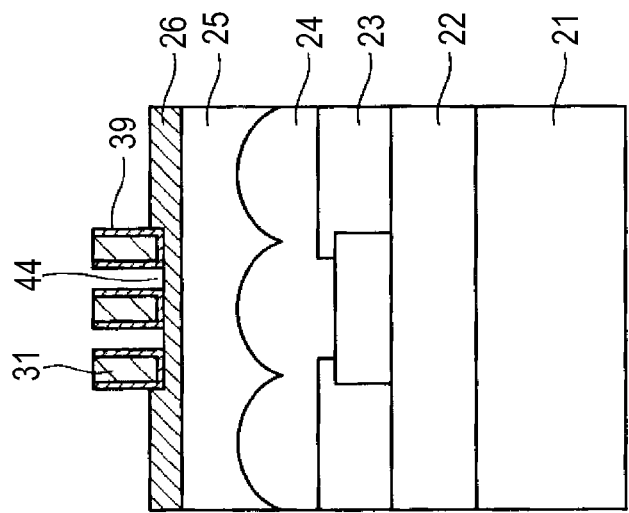
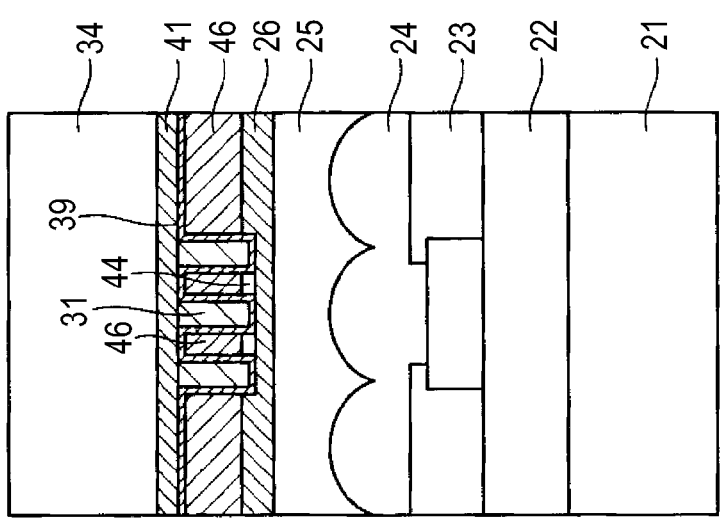
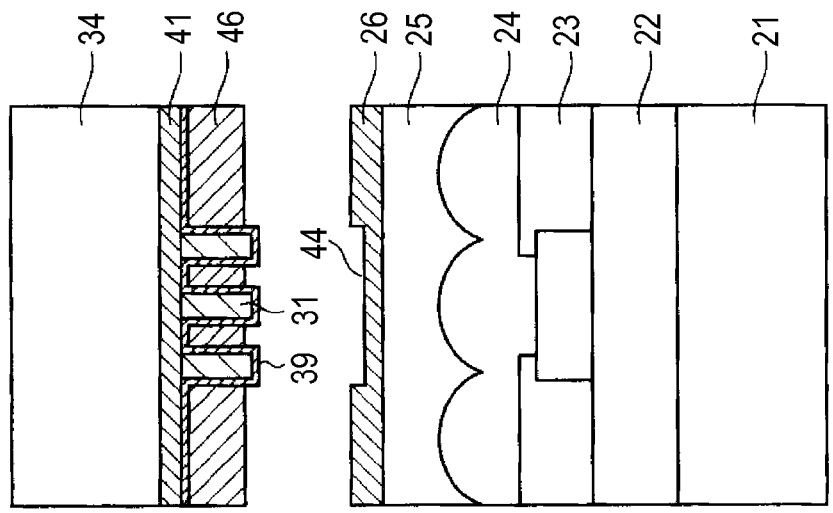

MANUFACTURING METHOD OF SOLID-STATE IMAGING DEVICE AND SOLID-STATE IMAGING DEVICE

FIELD

The present disclosure relates to a manufacturing method of a solid-state imaging device having a polarizer and the solid-state imaging device.

BACKGROUND

An optical device in which polarizers are arranged so that the polarization direction differs in respective small regions and electronic devices formed by integrating the optical device are commercialized as typified by displays and measuring devices. For example, stereo video can be viewed by simple polarized glasses by bonding a filter in which micro-polarizers are arranged regularly to a flat panel display such as a liquid crystal monitor.

Incidentally, a relatively large-sized system dealing with polarization split in a device such as a liquid crystal projector, polarization directions are uniformly controlled in respective light paths as the device has light paths of RGB independently. In this case, the size of the whole system will be relatively large, which is several centimeters square, though it is not necessary to change the polarizer's direction in respective pixel regions.

As heat resistance is required particularly in the liquid crystal projector, a reflection-type wire-grid polarizer is widely used in view of characteristic lifetime of the device. In the reflection-type wire-grid polarizer, the thickness thereof can be suppressed to several 100 nm or less when visible light is polarized. However, extinction is performed by reflection in the reflection-type wire-grid polarizer. Therefore, reflection return light from the polarizer will be stray light or flare according to installation places in the set, which may affect video quality.

Accordingly, an absorption-type wire-grid polarizer (WGP) using an inorganic polarizer is proposed (for example, see JP-A-2008-216956 (Patent Document 1)). The WGP includes a reflection layer made of belt-shaped thin films formed in one dimensional grid shape with a pitch smaller than a wavelength of light in a used bandwidth, a dielectric layer formed on the reflection layer and an absorption layer made of inorganic fine particles formed on the dielectric layer. The inorganic fine particles of the absorption layer have light absorption action.

The above absorption-type WGP can be manufactured by the following method.

First, a device in which the WGP is formed, for example, a photoelectric conversion device 100 is prepared as shown in FIG. 13A. Next, a planarization layer 101 is formed on a surface of the photoelectric conversion device 100 as shown in FIG. 13B. Next, an insulating layer 102 is formed on the planarization layer 101 as shown in FIG. 13C. Then, a reflection layer 103 made of metal thin lines is formed on the insulating layer 102 with lines and spaces. Subsequently, an insulating layer 104 is formed on the reflection layer 103. Next, an absorption layer 105 is formed in a rectangular island pattern with island distribution by using inorganic materials having absorptive action, for example, metal, semiconductor materials and the like.

According to the above method, the absorption-type WGP allowing incident light to be spatially split into polarized light can be integrally formed. The photoelectric conversion device formed by this method can be formed by normal semiconductor processes, which can be applied to small video devices.

SUMMARY

When the above absorption-type WGP is applied to a CCD photoelectric conversion device or a CMOS photoelectric conversion device, a method of forming the polarizer on a top surface of micro-lenses in a pixel portion by using semiconductor processes can be considered.

However, the micro-lenses or color filters on the photoelectric conversion device are generally made of organic resin material having low heat resistance or low film strength.

For example, in the case where a $SiO_2$ layer is formed by using a plasma CVD method which is a common method of forming an interlayer insulating layer of a semiconductor device, the formation temperature is 350 to 400 degrees. However, the resin material is sublimed or decomposed in the range of temperatures. Therefore, an insulating layer to be a base of the WGP and an insulating layer formed between the reflection layer and the absorption layer of the WGP have to be formed at temperatures lower than durable temperatures of resin, for example, at 220 degrees or less. Accordingly, it is necessary to decrease the temperature at which the metal film is formed or to reduce the film stress in processes of forming the polarizer.

However, in the insulating layer formed by the above low-temperature process, the increase of the moisture-absorption property due to the density reduction will be a problem. For example, corrosion caused by moisture absorption of the film causes the reduction of long-term reliability of the device. As described above, there are limitations, particularly in the temperature range in the above manufacturing method, therefore, reduction of reliability in the manufactured solid-state imaging device will be a problem.

In view of the above, it is desirable to provide a solid-state imaging device including a wire-grid polarizer with high reliability.

An embodiment of the present disclosure is directed to a manufacturing method of a solid-state imaging device including preparing a photoelectric conversion device, forming an insulating layer on a surface of the photoelectric conversion device, forming a wire-grid polarizer on a support base, bonding a forming surface of the wire-grid polarizer on the support base to the insulating layer on the surface of the photoelectric conversion device and removing the support base from the wire-grid polarizer.

Another embodiment of the present disclosure is directed to a solid-state imaging device including a photoelectric conversion device, an insulating layer formed on the photoelectric conversion device and a wire-grid polarizer formed on the insulating layer, in which a concave portion is formed in the insulating layer, and a sidewall of the wire-grid polarizer is formed to touch an inner wall of the concave portion formed on the insulating layer.

In the manufacturing method of the solid-state imaging device according to the embodiment of the present disclosure, the wire-grid polarizer is formed on the base different from the base of the photoelectric conversion device. Accordingly, it is not necessary to reduce the process temperature and reduce the stress at the time of forming the wire-grid polarizer. Therefore, the WGP can be formed in process conditions with higher reliability.

In the solid-state imaging device according to the embodiment of the present disclosure, the positional accuracy can be improved at the time of bonding the wire-grid polarizer formed on the different base to the surface of the photoelectric conversion device by the above method.

According to the embodiments of the present disclosure, the solid-state imaging device including the wire-grid polarizer with high reliability can be provided.

BRIEF DESCRIPTION OF THE DRAWINGS

FIGS. 3A to 3C are manufacturing process views of a wire-grid polarizer relating to the manufacturing method of the solid-state imaging device according to the embodiment of the present disclosure;

FIGS. 4A to 4F are manufacturing process views of the wire-grid polarizer relating to the manufacturing method of the solid-state imaging device according to the embodiment of the present disclosure;

FIGS. 5G to 5I are manufacturing process views of the wire-grid polarizer relating to the manufacturing method of the solid-state imaging device according to the embodiment of the present disclosure;

FIG. 6 is a structural view of the solid-state imaging device relating to the manufacturing method of the solid-state imaging device according to the embodiment of the present disclosure;

FIGS. 12A to 12C are manufacturing process views of the wire-grid polarizer relating to the manufacturing method of the solid-state imaging device according to further another embodiment of the present disclosure.

DETAILED DESCRIPTION

Hereinafter, modes for carrying out the present disclosure will be explained, and the present disclosure is not limited to the following examples.

The explanation will be made in the following order.
1. Structure of Solid-State Imaging Device
2. First Embodiment of Manufacturing Method of Wire-Grid Polarizer
3. Second Embodiment of Manufacturing Method of Wire-Grid Polarizer
4. Third Embodiment of Manufacturing Method of Wire-Grid Polarizer
5. Modification Example of Manufacturing Method of Wire-Grid Polarizer
1. Structure of Solid-State Imaging Device
[Structure of Solid-State Imaging Device]

Hereinafter, a specific embodiment of a manufacturing method of a solid-state imaging device according to an embodiment of the present disclosure will be explained.

Figure 1:
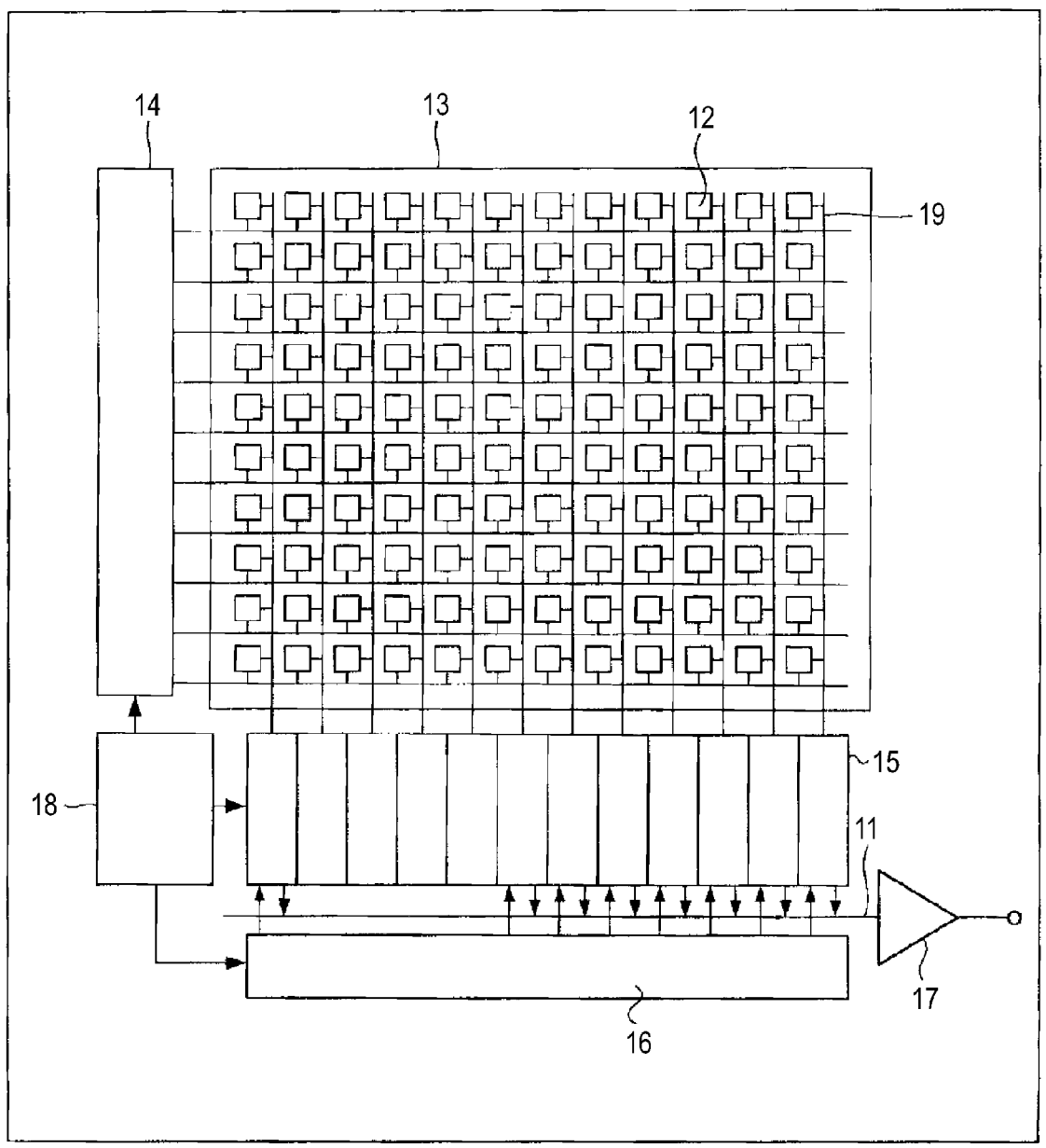
FIG. 1 is a structural view of a solid-state imaging device relating to a manufacturing method of the solid-state imaging device according to an embodiment of the present disclosure.

FIG. 1 shows a schematic structure of a CMOS (Complementary Metal Oxide Semiconductor)-type solid-state imaging device as an example of a solid-state imaging device relating to the manufacturing method according to the embodiment of the present disclosure.

A solid-state imaging device 10 shown in FIG. 1 includes a pixel unit (so-called imaging area) 13 in which plural pixels 12 including photodiodes to be photoelectric converters are regularly arranged in a two-dimensional manner on a semiconductor base, for example, a silicon substrate and a peripheral circuit unit. The pixel 12 includes the photodiode and plural pixel transistors (so-called MOS transistors).

Plural pixel transistors can include three transistors, for example, a transfer transistor, a reset transistor and an amplifier transistor. Additionally, a selection transistor can be added as the fourth transistor.

The peripheral circuit unit includes a vertical drive circuit 14, column signal processing circuits 15, a horizontal drive circuit 16, an output circuit 17, a control circuit 18 and so on.

The control circuit 18 generates a clock signal or a control signal to be operation references of the vertical drive circuit 14, the column signal processing circuits 15, the horizontal drive circuit 16 and the like based on a vertical synchronization signal, a horizontal synchronization signal and a master clock. The control circuit 18 inputs these signals to the vertical drive circuit 14, the column signal processing circuits 15, the horizontal drive circuit 16 and the like.

The vertical drive circuit 14 includes, for example, a shift register. The vertical drive circuit 14 selectively scans respective pixels 12 in the pixel unit 13 in the vertical direction sequentially on a row basis, supplying pixel signals based on signal charges generated in accordance with the light receiving amount in the photoelectric converters of respective pixels 12 to the column signal processing circuits 15 through vertical signal lines 19.

The column signal processing circuits 15 are arranged at, for example, respective columns of pixels 12, performing signal processing such as noise removal of signals outputted from pixels 12 of one row based on signals from black reference signals (to be formed around an effective pixel area) on a pixel column basis. That is, the column signal processing circuits 15 performs signal processing such as a CDS (correlated double sampling) for removing fixed pattern noise unique to pixels 12, signal amplification and so on. At output stages of the column signal processing circuits 15, horizontal selection switches (not shown) are connected between the column signal processing circuits 15 and a horizontal signal line 11.

The horizontal drive circuit 16 includes, for example, a shift register. The horizontal drive circuit 16 sequentially selects respective column signal processing circuits 15 by sequentially outputting a horizontal scanning pulse, outputting pixel signals from respective column signal processing circuit 15 to the horizontal signal line 11.

The output circuit 17 performs signal processing to signals sequentially supplied from respective column signal processing circuits 15 through the horizontal signal line 11 and outputs the signals.

When the above solid-state imaging device 10 is applied to a back-illuminated solid-state imaging device, plural wiring layers are not formed on the back surface on the side of the light incident surface (so-called light receiving surface) and plural wiring layers are formed on the front surface side opposite to the light receiving surface.

[Structure of a Wire-Grid Polarizer (WGP)]

Figure 2:
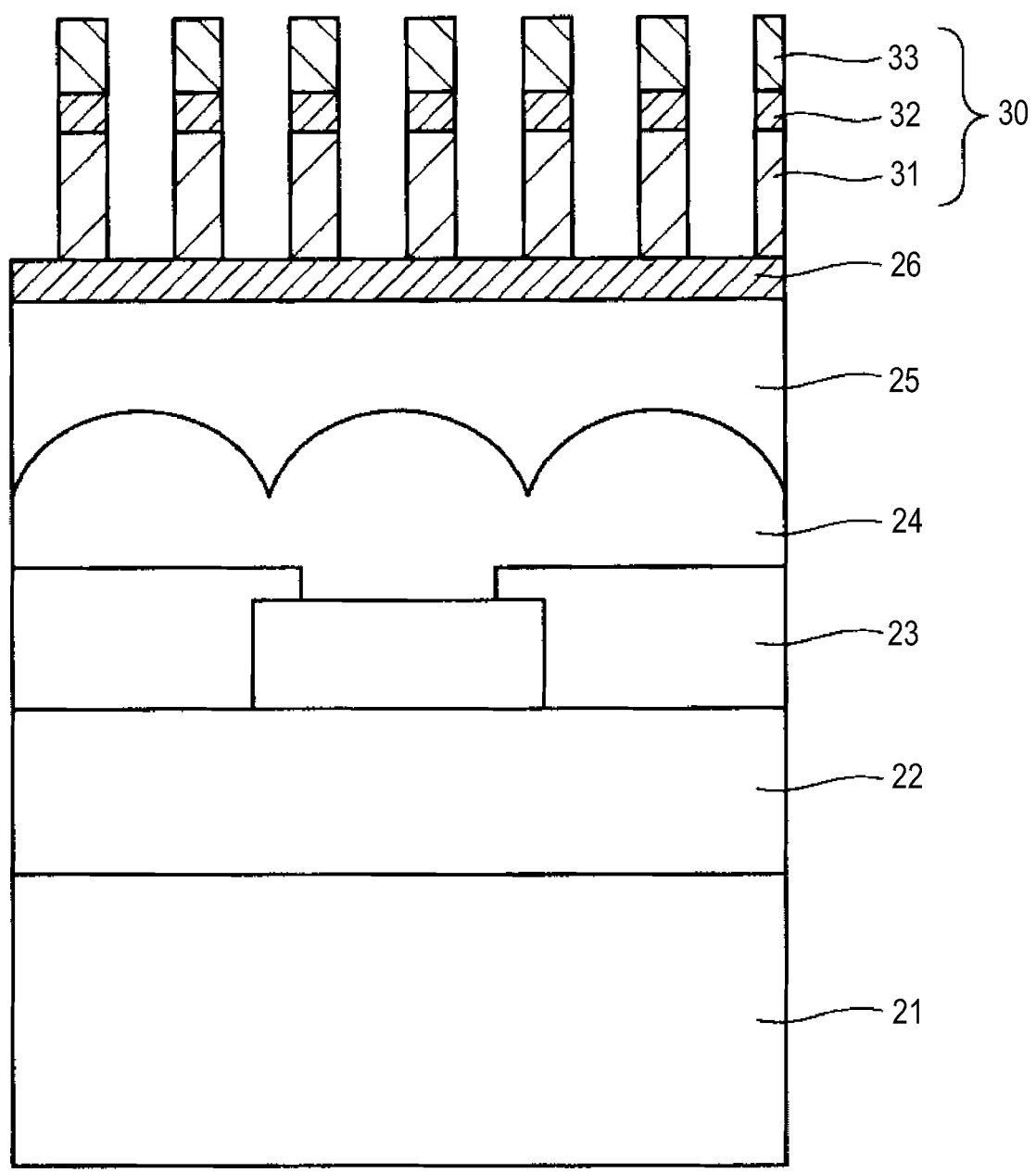
FIG. 2 is a structural view of the solid-state imaging device relating to the manufacturing method of the solid-state imaging device according to the embodiment of the present disclosure.

Next, a structure of the CMOS solid-state imaging device on color filters provided on the pixel unit is shown in FIG. 2.

In FIG. 2, the photoelectric converters provided on a semiconductor base, various transistors, the CMOS circuit, an upper wiring layer and so on are shown as a base device 21. On the base device 21, a device planarization layer 22 for forming an optical unit, color filters 23 and micro-lenses 24 formed on the color filters are provided. Furthermore, a micro-lens planarization layer 25 is provided on the micro-lenses 24.

On the micro-lens planarization layer 25, a stopper insulating layer 26 and a wire-grid polarizer (WGP) 30 are formed. The WGP 30 includes a reflection layer 31 formed on the stopper insulating layer 26, an insulating layer 32 formed on the reflection layer 31 and an absorption layer 33 formed on the insulating layer 32.

The reflection layer 31 is formed in one dimensional grid shape with a pitch smaller than a wavelength of the visible light range by belt-shaped thin films extending in a direction parallel to the principal surface of the base. The direction in which the reflection layer 31 extends in one dimensional grid shape (direction parallel to the extending direction of the reflection layer 31) corresponds to a polarization direction for extinction. Additionally, a direction in which one-dimensional grid shape is repeated (direction orthogonal to the extending direction of the reflection layer 31) corresponds to a polarization direction for transmission.

Namely, the reflection layer 31 has common functions of the WGP, attenuating polarized waves (one of TE-wave/S-wave and TM-wave/P-wave) having a field effect component in the direction parallel to the extending direction of the reflection layer 31 in light which is incident in each repeat of grids in the reflection layer 31. The reflection layer 31 transmits polarized waves (the other of TE-wave/S-wave and TM-wave/P-wave) having a field effect component in the direction orthogonal to the extending direction of the reflection layer 31.

Materials for grids of the normal WGP can be used in the reflection layer 31. For example, metal materials or semiconductor materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), tellurium (Te) and so on, as well as alloy materials including the above can be used. It is also possible to form the reflection layer 31 by using an inorganic material layer or a resin layer with the increased reflectance on the surface, for example, by coloring.

The insulating layer 32 is formed on the reflection layer 31. The insulating film 32 is made of optical materials transparent to visible light, for example, materials such as $SiO_2$, $Al_2O_3$, $MgF_2$ and so on can be used.

The insulating layer 32 will be a base layer of the absorption layer 33. Additionally, the insulating layer 32 is formed for adjusting phases of polarized light reflected on the absorption layer 33 and polarized light transmitted through the absorption layer 33 and reflected on the reflection layer 31 and reducing the reflectance by interference effect. Accordingly, the insulating layer 32 is preferably formed to have a thickness whereby the phase of polarized light reflected on the reflection layer 31 is shifted from the phase of polarized light reflected on the absorption layer 33 by a half-wavelength. It is also possible to improve the extinction ratio even when the thickness of the insulating layer 32 is not optimized for the interference effect because the absorption layer 33 has light absorption effect.

A refractive index of the insulating layer 32 is preferably higher than 1.0 and 2.5 or less. Optical characteristics of the absorption layer 33 are affected also by the refractive index in the vicinity thereof, therefore, polarizer characteristics of the WGP 30 can be controlled by adjusting the refractive index of the insulating layer 32.

The absorption layer 33 is intermittently formed on the insulating layer 32 so as to be apart in the one dimensional grid direction of the reflection layer 31. That is, the planar shape of the absorption layer 33 on the insulating layer 32 has a rectangular island pattern. The absorption layer 33 is formed to have the planar shape in which a long edge of the absorption layer 33 extends in the direction parallel to the extending direction of the reflection layer 31 and a short edge of the absorption layer 33 extends in the direction orthogonal to the extending direction of the reflection layer 31. Then, the direction of the long edge of the absorption layer 33 will be a light absorption axis of the polarizer and the direction of the short edge thereof will be a light transmission axis of the polarizer.

The absorption layer 33 is made of metal materials, alloy materials or semiconductor materials an extinction coefficient of which is not "0", namely, having light absorption action. The absorption layer 33 is also formed by including, for example, inorganic fine particles having light absorption action. For example, metal materials or semiconductor materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), tin (Sn) and so on, as well as alloy materials including the above can be used. Additionally, silicide-series materials such as $FeSi_2$ (particularly, $\beta$-$FeSi_2$), $MgSi_2$, $NiSi_2$, $BaSi_2$, $CrSi_2$, $CoSi_2$ and the like can be used.

Particularly, aluminum/alloys thereof, $\beta$-$FeSi_2$, semiconductor materials including germanium or tellurium are used as materials for forming the absorption layer 33, thereby obtaining high contrast (high extinction ratio) in the visible light range. In order to give polarization characteristics to light in wavelength bands other than visible light, for example, infrared light, materials such as silver (Ag), copper (Cu), gold (Au) a resonance wavelength of which is in the vicinity of the infrared range are used as materials for forming the light absorption layer.

The above-described WGP can be a single-layer polarizer including the reflection layer alone. The single-layer polarizer also functions as the normal WGP though operations are different from the above absorption-type WGP.

As the photoelectric conversion device applied to the solid-state imaging device including the WGP, not only the CMOS solid-state imaging device but also, for example, a CCD device, a CIS (Contact Image sensor), a CMD (Charge Modulation Device)-type signal amplifier image sensor and so on can be used. As the photoelectric conversion device, a front-illuminated photoelectric conversion device or a back-illuminated photoelectric conversion device can be applied.

2. First Embodiment of Manufacturing Method of Wire-Grid Polarizer

[Manufacturing Method of Wire-Grid Polarizer: First Embodiment]

Next, a first embodiment of a manufacturing method of a solid-state imaging device having the wire-grid polarizer will be explained.

First, as shown in FIG. 3A, a photoelectric conversion device including photoelectric converters is prepared. In the photoelectric conversion device, micro-lenses 24 are formed for respective pixels and a concavoconvex shape of the micro-lenses 24 is formed on the uppermost surface.

Next, as shown in FIG. 3B, a transparent material within the used wavelength band is coated and planarized on the micro-lenses 24 by a spin-coating method and the like to thereby form the micro-lens planarization film 25. Then, as shown in FIG. 3C, the stopper insulating layer 26 is formed by using a transparent dielectric material within the used wavelength band and having sufficient dry-etching resistance as well as functioning as an etching stopper and a bonded surface at the time of bonding the substrate. As the dielectric material, the same materials of the insulating layer for forming the WGP can be used, for example, silicides such as $SiO_2$ can be used. The stopper insulating layer 26 is formed by using a sputtering method or a sol-gel method (method of applying a solution by the spin-coating method and allowing the solution to gelate by heat treatment).

Next, as shown in FIG. 4A an insulating layer 35 is formed on a support base 34. The insulating layer 35 is made of $SiO_2$ or the like to be approximately 150 nm by using, for example, a CVD method. Then, a resist layer 36 is formed on the insulating layer 35. Lithography patterning is performed to the formed resist layer 36 to form a resist pattern having openings at forming positions of the absorption layer of the WGP. Then, as shown in FIG. 4B, etching is performed to the insulating layer 35 by using the pattern of the resist layer 36. Island-shaped concave portions 38 for forming the absorption layer are formed in the insulating layer 35 by etching. After forming the concave portions 38, the resist layer 36 is removed.

Next, as shown in FIG. 4C, an absorption material layer 33A is formed on the insulating layer 35 so as to cover the concave portions 38. As the absorption material layer 33A, the above-described materials applied to the absorption layer, for example, tungsten (W) can be used to have a thickness of 10 nm. The absorption material layer 33A is formed by using the chemical vapor deposition (CVD) method, a coating method or physical vapor deposition methods such as the sputtering method.

Then, as shown in FIG. 4D, the absorption material layer 33A formed excessively on the concave portions 38 of the insulating layer 35 is removed and planarized by using, for example, a CMP method and so on. The absorption layer 33 buried into the insulating layer 35 in the island pattern is formed by the process.

Next, as shown in FIG. 4E, an insulating material layer 32A to be an insulating layer of the WGP is formed on the insulating layer 35 and the absorption layer 33. Moreover, a reflection material layer 31A to be a reflection layer of the WGP is formed on the insulating material layer 32A.

The insulating material layer 32A is formed by using, for example, the CVD method, the coating method, the PVD method, the sol-gel method and the like. The insulating material layer 32A is formed to have a thickness of 10nm by using the optical material transparent to visible light, for example, $SiO_2$.

The reflection material layer 31A is formed by using, for example, the CVD method, the coating method, the PVD method and the like. The reflection material layer 31A is formed to have a thickness of 150 nm by using above-described materials used as materials for grids of the normal WGP, for example, aluminum (Al) or alloys including Al.

Next, as shown in FIG. 4F, a patterned resist layer 37 is formed on the reflection material layer 31A. The lithography patterning is performed to the resist layer 37 so as to remain at positions where the WGP is formed. The lithography in the process is performed by using a photomask having a line and space pattern, and it is preferable to use KrF exposure at an exposure wavelength of 248 nm or ArF exposure at an exposure wavelength of 193 nm.

Next, as shown in FIG. 5G, the reflection material layer 31A is etched by using the resist layer 37. The pattern of the resist layer 37 is transcribed to the reflection material layer 31A by the etching to form the reflection layer 31 of the WGP. After the etching, the resist layer 37 is peeled off.

Furthermore, the insulating layer 35 and the insulating layer 32 are etched by using the reflection layer 31 to which the pattern is transcribed as a mask. According to the process, a WGP 30 including the absorption layer 33, the insulating layer 32 and the reflection layer 31 is formed on the support base 34.

Next, as shown in FIG. 5H, a passivation layer 39 covering the WGP 30 is formed. The passivation layer 39 is formed by using materials functioning as a protection layer of the WGP 30 as well as functioning as the bonded surface with respect to the stopper insulating layer 26 on the photoelectric conversion device. The passivation layer 39 can be formed by using, for example, the same materials as the insulating layer 32 forming the WGP, for example, silicides such as $SiO_2$. The passivation layer 39 is formed by using the CVD method, the sol-gel method and so on.

Next, as shown in FIG. 5I, the support base 34 is bonded on the photoelectric conversion device. At this time, the support base 34 is turned over and bonded so that passivation layer 39 on the WGP 30 formed on the support base 34 touches the stopper insulating layer 26 formed on the surface of the photoelectric conversion device.

The photoelectric conversion device and the support base are bonded together by forming a silanol group by activating the silicon oxide ($SiO_2$) layer formed on respective surfaces and using dehydration-condensation reaction. That is, the stopper insulating layer 26 of the photoelectric conversion device and the passivation layer 39 formed on the surface of the WGP 30 on the support base 34 are formed by using the silicon oxide ($SiO_2$) layer, thereby bonding these layers together by the above dehydration-condensation reaction.

As a method of activating the silicon oxide layer, a method used at the time of forming a SOI (Silicon on Insulator) wafer is generally applied. For example, hydrophilic treatment of the silicon oxide layer is performed by using chemicals such as oxygenated water to thereby perform the surface activation treatment. The surface activation treatment can be also by using oxygen plasma treatment.

Next, as shown in FIG. 6, the support base 34 is removed from the photoelectric conversion device. The removal of the support base 34 is performed by using a grinder such as a wafer grinder from the back surface (surface opposite to the forming surface of the WGP 30) side. Then, the insulating layer 35 and the passivation layer 39 formed on the WGP 30 are removed by using, for example, a fluoro-chemical to expose an upper surface of the reflection layer 31. According to the process, the WGP 30 is formed on the photoelectric conversion device through the stopper insulating layer 26.

According to the above processes, the solid-state imaging device in which the WGP 30 is formed can be manufactured.

After forming the WGP 30 on the photoelectric conversion device by the above processes, silicon oxide or silicon nitride is formed on the whole surface of the WGP 30 to have a thickness of, for example, 50 nm as a protection layer, thereby improving reliability of the polarizer.

In the manufacturing method of the above embodiment, the WGP is formed on the base different from the base in which the micro-lenses/color filters are formed. Accordingly, it is not necessary to reduce the temperature and reduce the stress at the time of forming the WGP. Therefore, the WGP can be formed in process conditions with higher reliability. In particular, the insulating layer made of silicon nitride and so on used for the stopper insulating layer and so on can be formed with higher density. As a result, the solid-state imaging device having the polarizer with higher reliability can be provided, which is capable of suppressing deterioration in the moisture-absorption property and improving reduction of long-term reliability of the device due to moisture absorption of the film.

In the above embodiment, the WGP 30 is formed by a stacked body including the reflection layer 31, the insulating layer 32 and the absorption layer 33, however, a single-layer polarizer including the reflection layer alone can be formed. When forming the WGP 30 by including the reflection layer alone, after forming the insulating layer 35 on the support base 34, the reflection material layer 31A is directly formed on the insulating layer 35 and the reflection layer 31 is formed by using lithography. Then, the passivation layer 39 is formed on the reflection layer 31. After that, the stopper insulating layer 26 and the passivation layer 39 are bonded together in the same manner as the above method. Then, the support base 34 and the like is removed to expose the reflection layer 31, thereby forming the WGP 30 on the photoelectric conversion device.

The size of the grid pattern of the WGP 30 is not limited to the above embodiment. In the above embodiment, the resist processing by KrF or ArF exposure is performed as the forming method of the polarizer, however, when it is necessary to apply the polarizer with a finer pitch, other methods will be used. For example, processing processes such as sidewall transfer processes (a sidewall process, a spacer process) shown in ITRS (Technology Roadmap for Semiconductors), a double patterning process and so on can be used.

Also in the above embodiment, the silicon oxide film is used as the passivation layer formed on the WGP 30, however, it is not limited to this and other silicides capable of forming the silanol group by hydrophilic treatment and activation treatment can be used. For example, an insulating layer made of the silicide such as SiN, SiON, SiOC, SiC and SiCN can be used.

3. Second Embodiment of Manufacturing Method of Wire-Grid Polarizer

[Manufacturing Method of Wire-Grid Polarizer: Second Embodiment]

In the above first embodiment, portions between grids included in the wire grid polarizer (WGP) are hollow, therefore, the bonded surface at the time of bonding the support base on which the WGP is formed to the base on the photoelectric conversion device's side is small. Accordingly, when a gap is generated or bonding strength is reduced at the time of bonding in processes such as removing the excessive substrate, the WGP may be peeled off from the bonded surface.

When there are the above hollows, the WGP may be peeled off from the bonded surface due to enlargement of hollows by applied heat stress in manufacturing processes after bonding.

As countermeasures against the above problems, a process of planarizing the surface by burying portions between grids of the polarizer with, for example, an organic insulting film is provided in the second embodiment. The second embodiment of the manufacturing method of the solid-state imaging device having the wire-grid polarizer will be explained as follows. The same signs are given to the same components as the first embodiment and detailed explanation is omitted.

First, the stopper insulating layer 26 is formed on the photoelectric conversion device in the same manner as the processes shown in FIGS. 3A to 3C of the first embodiment.

Figure 7A:
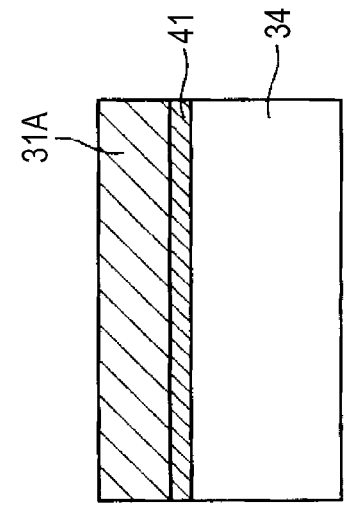
FIGS. 7A to 7C are manufacturing process views of a wire-grid polarizer relating to a manufacturing method of the solid-state imaging device according to another embodiment of the present disclosure.

Next, as shown in FIG. 7A, an insulating layer 41 to be the base for forming the polarizer and the etching stopper in processing processes is formed on the support base 34. The insulating layer 41 is made of $SiO_2$ and so on by using for example, the CVD method. The reflection material layer 31A to be the reflection layer of the WGP is formed on the insulating layer 41.

Figure 7B:
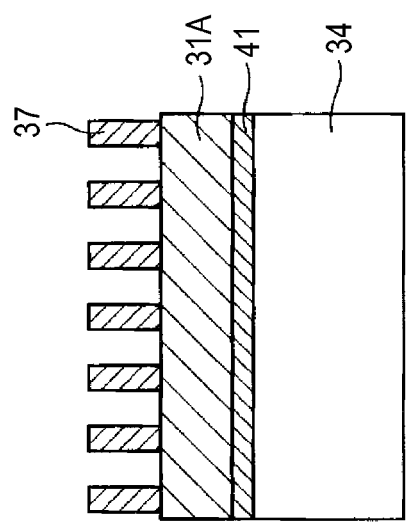

Next, as shown in FIG. 7B, the patterned resist layer 37 is formed on the reflection material layer 31A. The reflection material layer 31A is formed by using, for example, the CVD method, the coating method, the PVD method and so on. The reflection material layer 31A is formed to have a thickness of 150 nm by using materials used for grids of the normal WGP, for example, aluminum (Al) or alloys including Al. The lithography patterning is performed to the resist layer 37 so as to remain at positions where the WGP is formed.

Figure 7C:
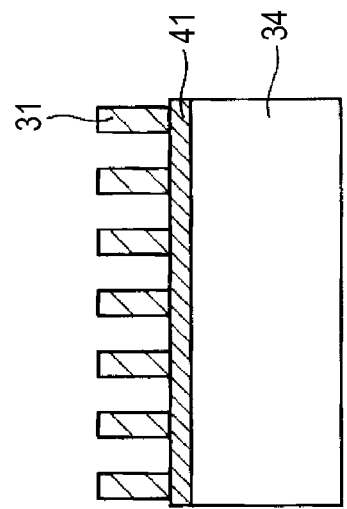

Next, as shown in FIG. 7C, the reflection material layer 31A is etched by using the resist layer 37. The pattern of the resist layer 37 is transcribed to the reflection material layer 31A by the etching to form the reflection layer 31 of the WGP. After the etching, the resist layer 37 is peeled off.

Figure 8D:
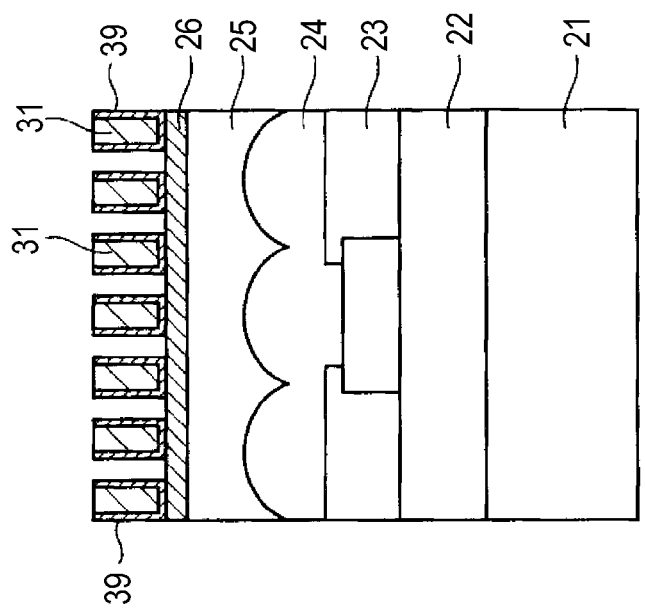
FIGS. 8D to 8F are manufacturing process views of the wire-grid polarizer relating to the manufacturing method of the solid-state imaging device according to another embodiment of the present disclosure.

Next, as shown in FIG. 8D, the passivation layer 39 covering the reflection layer 31 and the insulating layer 42 burying portions between grids of the reflection layer 31 are formed. The passivation layer 39 is formed by using materials functioning as a protection layer of the reflection layer 31 as well as functioning as a bonded surface with respect to the stopper insulating layer 26 on the photoelectric conversion device.

The insulating layer 42 is preferably made of organic insulating materials such as polyarylene. The insulating layer 42 is preferably made of organic materials capable of applying the coating method such as the spin-coating method for simplifying the forming process and a later-described removal process.

The insulating layer 42 is formed so that an upper surface of the passivation layer 39 formed on the reflection layer 31 is exposed. That is, the insulating layer 42 is formed so that the upper surface of the passivation layer 39 is positioned higher than the insulating layer 42 or so that the upper surface of the passivation layer 39 is on the same height as the insulating layer 42.

Figure 8E:
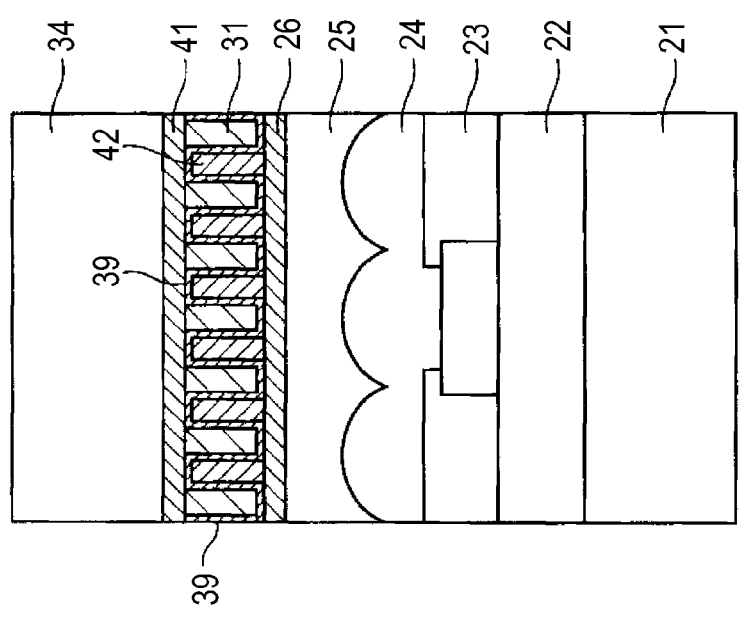

Next, as shown in FIG. 8E, the support body 34 is bonded on the photoelectric conversion device. At this time, the support base 34 is turned over and bonded so that passivation layer 39 formed on the support base 34 touches the stopper insulating layer 26 formed on the surface of the photoelectric conversion device. The photoelectric conversion device and the support base are bonded together by forming the silanol group by activating the stopper insulating layer 26 and the passivation layer 39 and using dehydration-condensation reaction.

Figure 8F:
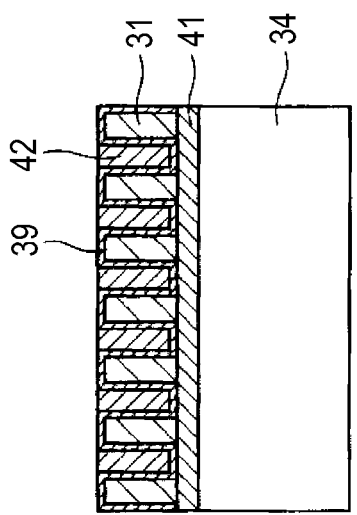

Next, as shown in FIG. 8F, the support base 34 is removed from the photoelectric conversion device by using a grinder such as the wafer grinder. Then, the insulating layer 41 formed on the upper surface of the reflection layer 31 and the passivation layer 39 formed on the insulating layer 42 are removed by using, for example, a fluoro-chemical to expose the upper surface of the reflection layer 31.

Furthermore, the insulating layer 42 formed between grids in the reflection layer 31 is removed. The removal of the insulating layer 42 is performed by using etching by, for example, oxygen plasma.

According to the above processes, the solid-state imaging device in which the reflection layer 31 is formed as the WGP can be manufactured.

In the second embodiment, the insulating layer is formed between respective reflection layers of the WGP at the time of bonding the base as compared with the first embodiment. Therefore, hollows to be the cause of the peeling of the substrate are not formed. Consequently, the solid-state imaging device including the polarizer with higher reliability can be provided.

The single-layer polarizer including the reflection layer 31 alone as the WGP is used in the present embodiment, however, the shape of the polarizer is not particularly limited to this, and for example, the absorption polarizer including the absorption layer, the insulating layer and the reflection layer as in the first embodiment. In this case, after forming the WGP having the stacked structure including the absorption layer to the reflection layer on the support base in the same manner as in the first embodiment, then, the insulating layer is formed between grids of the WGP.

4. Third Embodiment of Manufacturing Method of Wire-Grid Polarizer

[Manufacturing Method of Wire-Grid Polarizer: Third Embodiment]

In the above first embodiment and the second embodiment, when the support base on which the polarizer is formed is bonded to the base in which the photoelectric conversion device is formed, the polarizer formed on the support base uniformly is bonded on the flat surface on the photoelectric conversion device.

In order to allow the polarizer to function as the on-chip polarizer having high performance, it is necessary to form the polarizer on the micro-lenses with high positional accuracy. Therefore, high accuracy in alignment is requested at the time of bonding the polarizer.

In response to the above request, a manufacturing method capable of improving positional accuracy in the substrate bonding is provided in the third embodiment. Hereinafter, the third embodiment of the manufacturing method of the solid-state imaging device including the wire-grid polarizer will be explained. The same signs are given to the same components as the first embodiment and the second embodiments, and the detailed explanation is omitted.

Figure 9A:
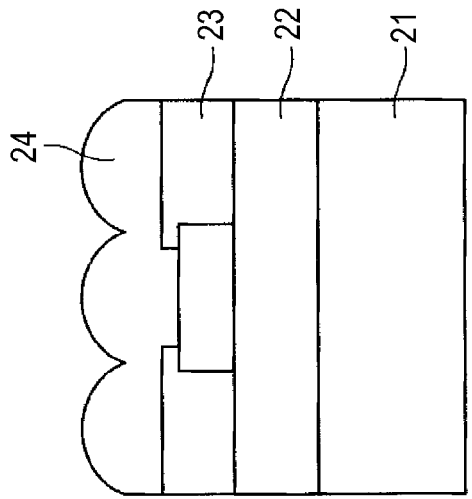
FIGS. 9A to 9C are manufacturing process views of a wire-grid polarizer relating to a manufacturing method of the solid-state imaging device according to further another embodiment of the present disclosure.
Figure 9B:
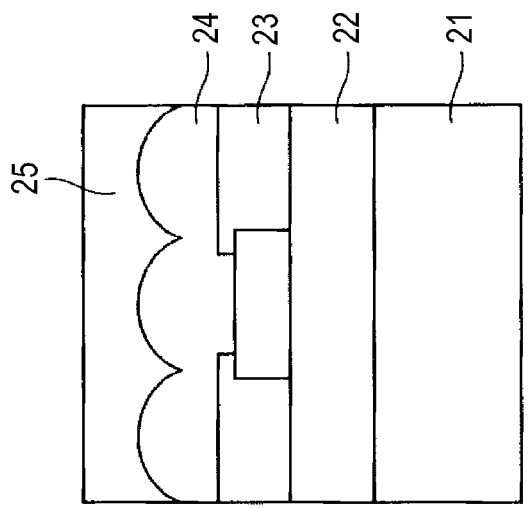

First, as shown in FIG. 9A, a photoelectric conversion device having photoelectric converters is prepared, in which micro-lenses 24 are formed at respective pixels and the concavoconvex shape of the micro-lenses 24 remain on the uppermost surface. Then, a transparent material within the used wavelength band is coated and planarized on the micro-lenses 24 to form the micro-lens planarization layer 25 as shown in FIG. 9B.

Figure 9C:
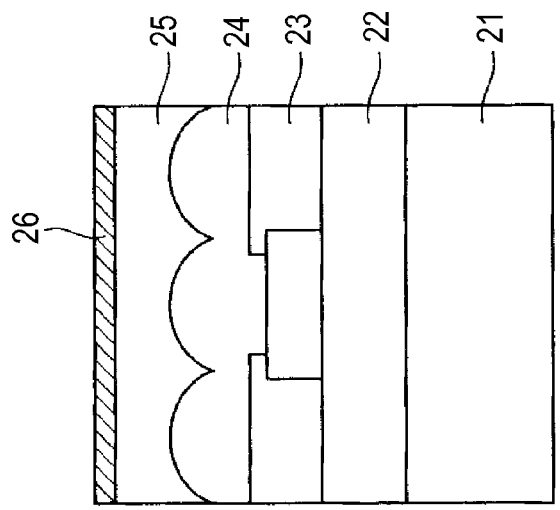

Next, as shown in FIG. 9C, the stopper insulating layer 26 is formed by using a transparent dielectric material within the used wavelength band and having sufficient dry-etching resistance as well as functioning as an etching stopper and a bonded surface at the time of bonding the substrate.

Figure 10D:
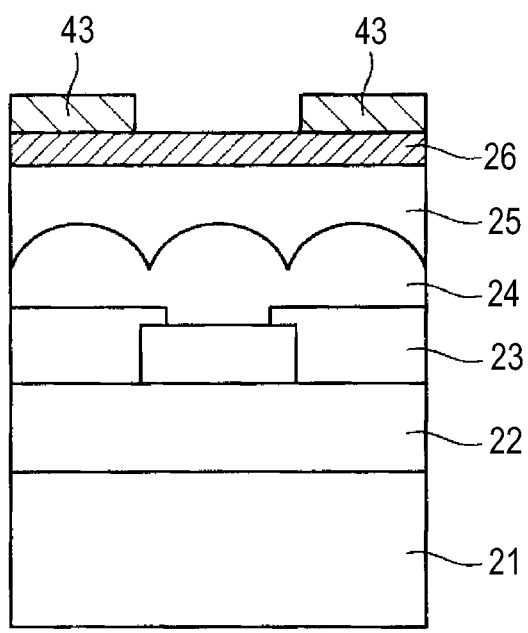
FIGS. 10D and 10E are manufacturing process views of the wire-grid polarizer relating to the manufacturing method of the solid-state imaging device according to further another embodiment of the present disclosure.
Figure 10E:
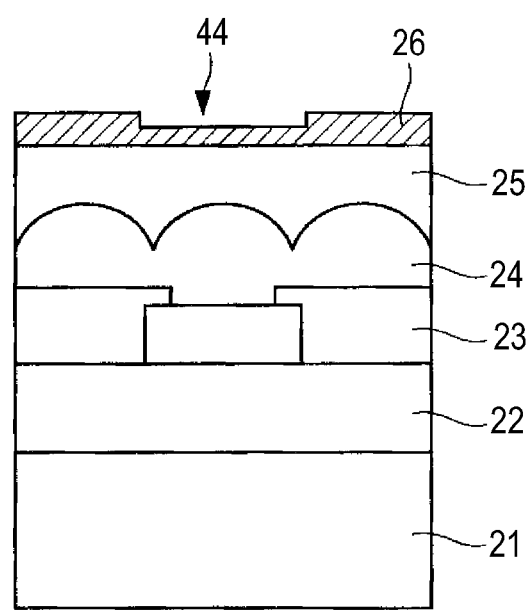

Next, as shown in FIG. 10D, a resist layer 43 is formed on the stopper insulating layer 26. Then, lithography patterning is performed to the resist layer 43 to form a resist pattern having an opening at a position to which the polarizer is bonded. Then, as shown in FIG. 10E, etching is performed to the stopper insulating film 26 by using the pattern of the resist layer 43 to form a concave portion 44 on the bonded surface of the device. After forming the concave portion 44, the resist layer 43 is removed.

The concave portion 44 is a step in the stopper insulating layer 26 formed at the position opposite to the later-described polarizer to be in a convex shape. The etching of the stopper insulating layer 26 is performed by using the resist layer 43 patterned by using, for example, a rectangular pattern to thereby form the concave portion 44 having a depth of, for example, 30 nm in the stopper insulating layer 26.

The stopper insulating layer 26 in which the concave step is formed on the photoelectric conversion device is formed by the above process.

Figure 11A:
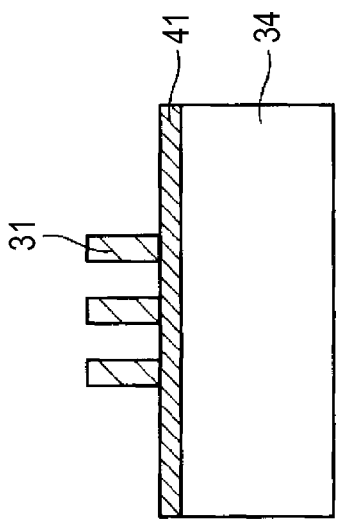
FIGS. 11A and 11E are manufacturing process views of the wire-grid polarizer relating to the manufacturing method of the solid-state imaging device relating to further another embodiment of the present disclosure.

Next, as shown in FIG. 11A, the insulating layer 41 to be the base for forming the polarizer and the etching stopper in processing processes is formed on the support base 34. The insulating layer 41 is made of $SiO_2$ and so on by using for example, the CVD method. The reflection material layer 31A to be the reflection layer of the WGP is formed on the insulating film 41.

Figure 11B:
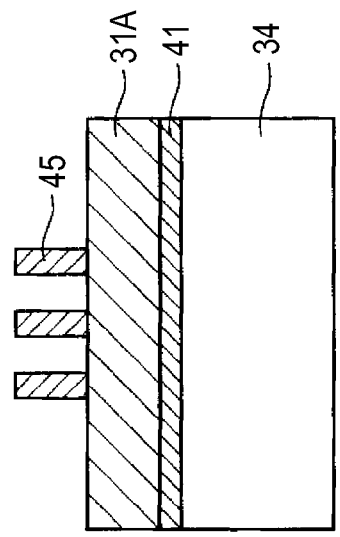

Then, as shown in FIG. 11B, a patterned resist layer 45 is formed on the reflection material layer 31A. The lithography patterning is performed to the resist layer 45 so as to remain at positions where the reflection layer 31 to be the wire-grid polarizer (WGP) is formed. The lithography in the process is performed by using the photomask having the line and space pattern, and it is preferable to use KrF exposure at an exposure wavelength of 248 nm or ArF exposure at an exposure wavelength of 193 nm.

Figure 11C:
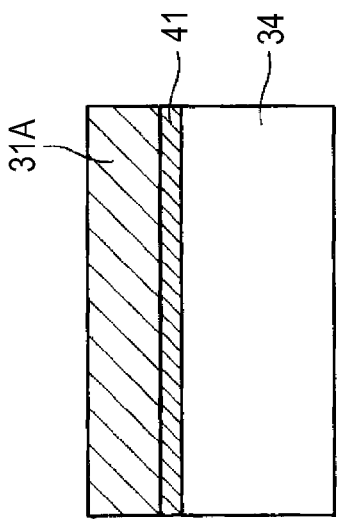

Next, as shown in FIG. 11C, the reflection material layer 31A is etched by using the resist layer 45. The pattern of the resist layer 45 is transcribed to the reflection material layer 31A by the etching to form the reflection layer 31 of the WGP. After the etching, the resist layer 45 is peeled off.

Figure 11D:
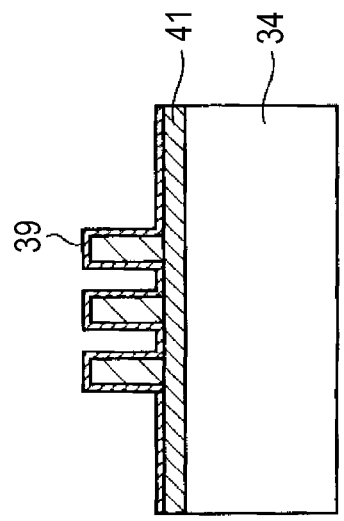

Next, as shown in FIG. 11D, the passivation layer 39 covering the reflection layer 31 is formed. The passivation layer 39 is formed by using materials functioning as a protection layer of the reflection layer 31 as well as functioning as the bonded surface with respect to the stopper insulating layer 26 on the photoelectric conversion device.

Figure 11E:
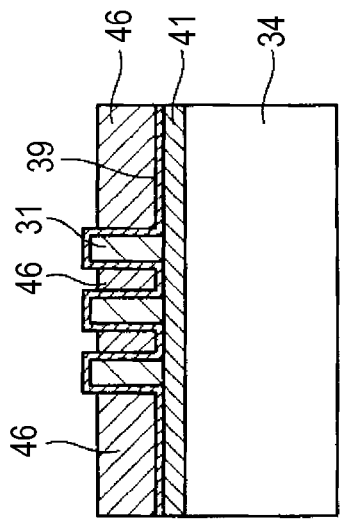
Figure 13C:
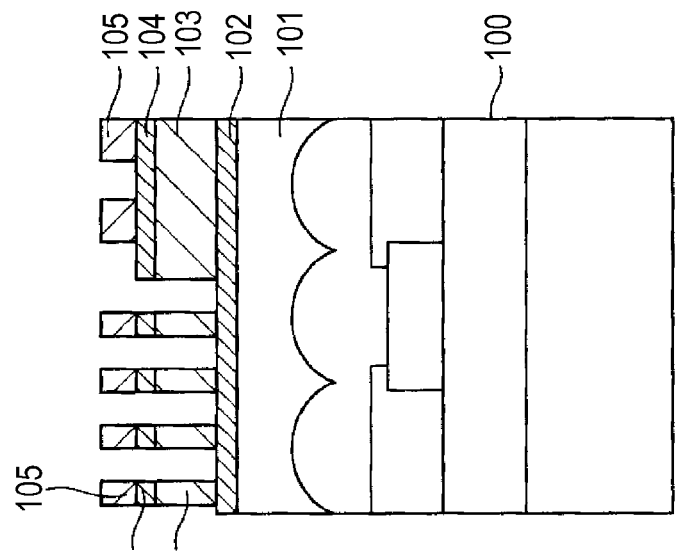
FIGS. 13A to 13C are manufacturing process views of a related-art wire-grid polarizer.
Figure 13B:
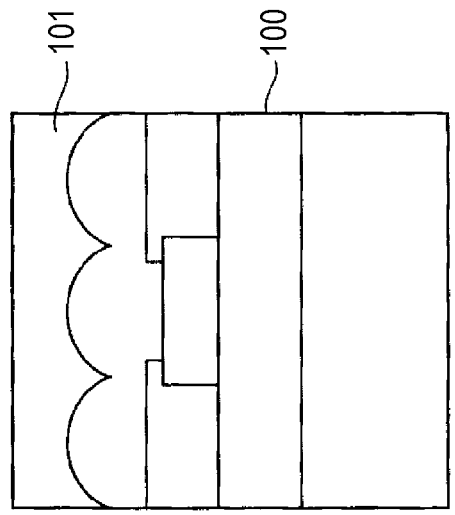
Figure 13A:
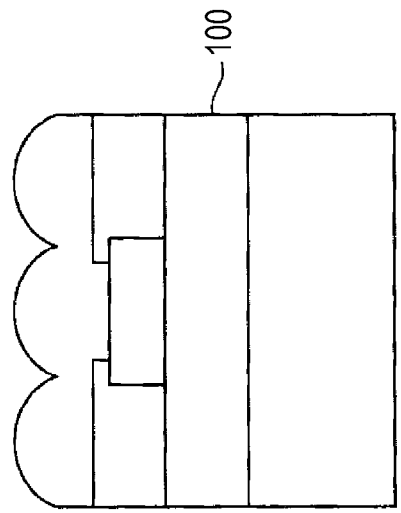

Next, as shown in FIG. 11E, an insulating layer 46 burying portions between grids of the reflection layer 31 is formed. The insulating layer 46 is formed extending to positions lower than the upper surface of the reflection layer 31 so that the reflection layer 31 has a convex shape. For example, an organic insulating material used for the insulating layer 46 is coated to be the same height as the reflection layer 31. Then, the insulating layer 46 is removed so as to be approximately 50 nm lower than the reflection layer 31 by performing etching by oxygen plasma.

According to the process, a convex portion including the reflection layer 31 and the passivation layer 39 are formed in the reflection layer 31 in which a convex step is provided with respect to the insulating layer 46.

Next, as shown in FIG. 12A, the support base 34 is bonded onto the photoelectric conversion device. At this time, the support base 34 is turned over and bonded so that passivation layer 39 formed on the support base 34 touches the stopper insulating layer 26 formed on the surface of the photoelectric conversion device. The photoelectric conversion device and the support base are bonded together by forming the silanol group by activating the stopper insulating layer 26 and the passivation layer 39 and using dehydration-condensation reaction.

The support base 34 is bonded onto the photoelectric conversion device so that the reflection layer 31 formed in the convex shape on the surface of the insulating layer 46 is fitted to the concave portion 44 of the stopper insulating layer 26 formed on the surface of the photoelectric conversion device as shown in FIG. 12B. That is, a side surface of the convex portion including the reflection layer 31 and the passivation layer 39 is allowed to touch an inner wall of the concave portion of the stopper insulating layer 26. As described above, the shape of a mortise-tenon joint is formed in which the convex portion including the reflection layer 31 is a tenon and the concave portion of the stopper insulating layer 26 is a mortise, thereby realizing accurate alignment. The alignment accuracy depends on the accuracy of lithography patterning used for forming the concave portion 44 in the stopper insulating layer 26. The concave portion 44 can be formed at an appropriate position and in an appropriate shape by performing patterning at the portion to which the reflection layer 31 is bonded with high accuracy. When the concave portion 44 is formed with high accuracy, accurate alignment utilizing the convex step of in the concave portion 44 can be realized. It is possible to minimize the positional displacement at the physical bonding of the substrate in the bonding of the support base onto the photoelectric conversion device by applying the shape of the mortise-tenon joint.

Next, as shown in FIG. 12C, the support base 34 is removed from the photoelectric conversion device by using a grinder such as the wafer grinder. Then, the insulating layer 41 formed on the upper surface of the reflection layer 31 and the passivation layer 39 formed on the insulating layer 46 are removed by using, for example, a fluoro-chemical to expose the upper surface of the reflection layer 31. Furthermore, the insulating layer 46 formed between grids in the reflection layer 31 is removed. The removal of the insulating layer 46 is performed by using etching by, for example, oxygen plasma.

According to the above processes, the solid-state imaging device in which the reflection layer 31 is formed as the WGP can be manufactured.

In the above third embodiment, the convex step is formed on the polarizer's side and the concave portion is formed at the opposite position on the surface of the photoelectric conversion device, which improves positional accuracy at the time of the bonding as the shape of the mortise-tenon joint. According to the method, the positional displacement at the physical bonding the substrate can be minimized. Accordingly, light transmitted through the polarizer and incident on the micro-lens is converged to the photoelectric converter efficiently. When the alignment accuracy between the polarizer and the photoelectric converter is reduced, polarized light is incident on an adjacent photoelectric converter, which causes deterioration in characteristics such as reduction of sensitivity, reduction of polarization characteristics and occurrence of color mixing. The polarizer is formed on the photoelectric converter with high accuracy of alignment, thereby improving the above characteristics and providing the solid-state imaging device including the high-performance polarizer.

The case where the step is formed at the portion where the reflection layer is formed has been explained in the third embodiment. It is preferable that a convex step (convex portion) is formed in any one of the support base's side (side where the polarizer is formed) and the photoelectric conversion device's side and a concave step (concave portion) corresponding to the concave step is formed in the other side. Accordingly, it is also preferable that the convex portion and the concave portion are formed in the support base and the photoelectric conversion device respectively at regions other than the region where the reflection layer is formed, for example, on a scribe line between chips. Also in this case, the support base and the photoelectric conversion device can be bonded with high accuracy.

The single-layer polarizer including the reflection layer 31 alone as the WGP is used in the present embodiment, however, the shape of the polarizer is not particularly limited to this, and for example, the absorption polarizer including the absorption layer, the insulating layer and the reflection layer as in the first embodiment. In this case, after forming the WGP having the stacked structure including the absorption layer to the reflection layer on the support base in the same manner as in the first embodiment, then, the insulating layer is formed between grids of the WGP.

5. Modification Example of Manufacturing Method of Wire-Grid Polarizer

[Modification Example: Transparent Support Base]

In the above third embodiment, the steps are formed in respective substrates to be bonded and the mortise-tenon joint is used to thereby improve the physical alignment accuracy. Generally, mechanical alignment is performed based on positional coordinates of respective bases in the bonding of bases in the manufacturing method of the semiconductor device and so on. To increase the accuracy of alignment in the bonding method of bases, a method of bonding bases while correcting the position by directly reading alignment marks formed on the base is used.

When the bonding of the base using the positional correction by the alignment marks is applied to the first embodiment, the second embodiment and the third embodiment, a transparent base, for example, a transparent glass substrate is used as the support base in which the wire-grid polarizer is formed.

It is possible to see the surface of the base on the photoelectric conversion device's side through the support substrate at the time of bonding the base by using the transparent glass substrate as the support base for forming the WGP. Accordingly, the bonding of the base can be performed while correcting the position of the support base by directly reading the alignment marks for alignment formed on the base on the photoelectric conversion device's side. Therefore, positional displacement between the WGP and the photoelectric conversion device at the time of bonding can be further reduced.

As a result, the solid-state imaging device including the high-performance polarizer in which reduction of sensitivity, reduction of polarization characteristics and occurrence of color mixing are suppressed can be provided.

In order to further improve visibility of alignment marks formed on the base on the solid-state imaging device's side, it is preferable that the insulating layer to be formed on the support base when forming the WGP is made of materials having high transparency to be an appropriate thickness. For example, when a silicon oxide film is formed to have a thickness of 100 nm or less as the insulating layer, the displacement amount in alignment can be further minimized.

In the above manufacturing methods according to the first to third embodiments, the formation of the wire-grid polarizer (WGP) is performed on the base different from the base in which the micro-lenses and color filters are formed. Accordingly, the process temperature is not limited to the temperature lower than the heat resistant temperature of the micro-lens or the color filter. Therefore, it is not necessary to reduce the process temperature and reduce the stress, and the solid-state imaging device including the WGP can be manufactured in process conditions with higher reliability.

Particularly, the insulating layer made of the silicon nitride film and the like used as the etching stopper film and so on can be formed with higher density. Accordingly, the moisture-absorption property of the film can be suppressed and the reduction of long-term reliability of the device due to moisture absorption of the film can be improved, thereby providing the solid-state imaging device with higher reliability.

According to the second embodiment, the insulating layer is formed between respective grids of the WGP at the time of bonding the base, therefore, hollows are not formed in the WGP. Accordingly, it is possible to suppress occurrence of peeling due to heat stress and so on after bonding the WGP in the manufacturing process of the solid-state imaging device. Therefore, the solid-state imaging device with high reliability can be provided.

In the above third embodiment, the convex-shaped WGP is formed on the support base and the concave step (concave portion) opposite to the convex step (convex portion) of the WGP is formed on the photoelectric conversion device's side, thereby bonding the support base to the photoelectric conversion device by the shape of the mortise-tenon joint. The positional displacement at the physical bonding of the base can be minimized by using the bonding method.

The polarizer is formed on the photoelectric converter with high positional accuracy, light transmitted through the polarizer is converged by the micro-lens and incident on the photoelectric converter efficiently. Accordingly, polarized light is prevented from being incident on an adjacent photoelectric converter, and the solid-state imaging device having the high-performance polarizer in which characteristics such as reduction of sensitivity, reduction of polarization characteristics and occurrence of color mixing are improved.

The present disclosure contains subject matter related to that disclosed in Japanese Priority Patent Application JP 2011-000805 filed in the Japan Patent Office on Jan. 5, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method of a solid-state imaging device comprising:
    preparing a photoelectric conversion device;
    forming an insulating layer on a surface of the photoelectric conversion device;
    forming a wire-grid polarizer on a support base;
    bonding a forming surface of the wire-grid polarizer on the support base to the insulating layer on the surface of the photoelectric conversion device and
    removing the support base from the wire-grid polarizer.

2. The manufacturing method of the solid-state imaging device according to claim 1,
    wherein the photoelectric conversion device is bonded to the support base by forming the insulating layer made of a silicide on the surface of the photoelectric conversion device, forming a passivation layer including the silicide on a surface of the wire-grid polarizer on the support base and activating the insulating layer and the passivation layer.

3. The manufacturing method of the solid-state imaging device according to claim 1,
    wherein a transparent base is used as the support base and alignment is performed by using alignment marks formed in the base on the photoelectric conversion's side through the support base at the time of bonding the support base to the photoelectric conversion device.

4. The manufacturing method of the solid-state imaging device according to claim 1,
    wherein the process of forming the wire-grid polarizer includes a process of forming a metal layer on the whole surface of the support base and a process of processing the metal layer into a grid-array state.

5. The manufacturing method of the solid-state imaging device according to claim 1,
    wherein the process of forming the wire-grid polarizer includes a process of forming an island-shaped absorption layer on the support base, a process of forming an insulating layer on the whole surface of the support base so as to cover the absorption layer, a process of forming the metal layer on the insulating layer and a process of processing the metal layer and the insulating layer into a grid-array state.

6. The manufacturing method of the solid-state imaging device according to claim 2, further comprising:
    forming an insulating layer between grids of the wire-grid polarizer after forming the wire-grid polarizer.

7. The manufacturing method of the solid-state imaging device according to claim 6,
    wherein the insulating layer is formed to be lower than the wire-grid polarizer and a convex shape by the wire-grid polarizer is formed on the insulating layer between grids in the process of forming the insulating layer between the grids of the wire-grid polarizer,
    a concave portion opposite to the convex portion by the wire-grid polarizer is formed in the process of forming the insulating layer on the surface of the photoelectric conversion device, and
    the convex shape by the wire-grid polarizer is aligned with and bonded to the concave portion of the insulating layer on the surface of the photoelectric conversion device.

8. A solid-state imaging device comprising:
    a photoelectric conversion device;
    an insulating layer formed on the photoelectric conversion device; and
    a wire-grid polarizer formed on the insulating layer,
    wherein a concave portion is formed in the insulating layer, and
    a sidewall of the wire-grid polarizer is formed to touch an inner wall of the concave portion formed on the insulating layer.

* * * * *